(12) United States Patent
Yang et al.

(10) Patent No.: US 8,581,282 B2
(45) Date of Patent: Nov. 12, 2013

(54) LIGHTING EMITTING DIODE DEVICE WITH DIRECTIVITY AND COHERENCY AND MANUFACTURING METHOD FOR PROVIDING LIGHT WITH DIRECTIVITY AND COHERENCY

(75) Inventors: Cheng-Wei Yang, Hsin-Chu (TW); Jwo-Huei Jou, Hsin-Chu (TW)

(73) Assignee: National Tsing Hua University, Hsin-Chu (TW)

( * ) Notice: Subject to any disclaimer, the term of this patent is extended or adjusted under 35 U.S.C. 154(b) by 269 days.

(21) Appl. No.: 12/868,961

(22) Filed: Aug. 26, 2010

(65) Prior Publication Data
US 2011/0303900 A1  Dec. 15, 2011

(30) Foreign Application Priority Data

Jun. 9, 2010 (TW) ................................ 99118814 A

(51) Int. Cl.
*H01L 33/00* (2010.01)
(52) U.S. Cl.
USPC .................................. 257/98; 438/29; 257/40

(58) Field of Classification Search
USPC ....................................................... 257/98, 40
See application file for complete search history.

(56) References Cited

U.S. PATENT DOCUMENTS

2002/0176475 A1* 11/2002 Sai et al. .......................... 372/96
2008/0030131 A1* 2/2008 Duarte et al. ................. 313/506

* cited by examiner

*Primary Examiner* — Eva Yan Montalvo
(74) *Attorney, Agent, or Firm* — WPAT, P.C.; Anthony King

(57) ABSTRACT

The present invention discloses a lighting emitting diode device with directivity and coherency and a manufacturing method for providing a light with directivity and coherency. The light emitting diode device comprises a substrate, a light emitting diode module and a masking layer. The light emitting diode module is disposed on the substrate, and is provided for emitting a light, and the masking layer is disposed on the light emitting diode module. The masking layer has an opening, and an aperture of the opening is matching with the wavelength of the light. The light with directivity and coherency is generated by the diffraction effect when the light passes through the opening.

6 Claims, 8 Drawing Sheets

7

LIGHTING EMITTING DIODE DEVICE WITH DIRECTIVITY AND COHERENCY AND MANUFACTURING METHOD FOR PROVIDING LIGHT WITH DIRECTIVITY AND COHERENCY

BACKGROUND OF THE INVENTION

1. Field of the Invention

The present invention is related to a light emitting diode device and a manufacturing method for providing a light source, more particularly to a light emitting diode device with directivity and coherency and a manufacturing method for providing a light source with directivity and coherency.

2. Description of Related Art

The laser light has the characteristics with high parallel, monochrome and high intensity. In the beginning, the laser light is applied to the remove control, the science search, the industry and the military affairs. Nowadays, they are applied in daily life extensively.

For example, when the laser light has high energy value and high intensity, the laser light may be applied to cut the metal material, the welding and the engraving imprint. When the laser light has lower energy power, the laser light may be applied to the surgical operation, stop bleeding, the stain removal and the vision correction.

The laser is almost consisted of an exciting system, a laser medium and an optical resonance cavity. The exciting system may be provided for generating a power of light, electricity or chemistry reaction. The laser medium is defined as a medium to generate a laser light. For example, the laser medium may be the red diamond, the glass, the helium, the semiconductor or the organic dyes. The optical resonance cavity is provided for enhancing the luminance of laser, regulating, and assisting the wavelength and direction of the laser.

Because of the structure of the laser is complex, the manufacturing method of the laser is not easy and the cost is high.

SUMMARY OF THE INVENTION

According to the above problems, the purpose of the present invention is to provide a light emitting diode device with directivity and coherency and a manufacturing method for providing a light source with directivity and coherency. In certain aspects, the light emitting diode device may replace the laser, and reduce the cost of manufacture.

According to the purpose of the present invention is to provide a light emitting diode device with directivity and coherency. The light emitting diode device comprises a substrate, a light emitting diode module, and a masking layer. The light emitting diode module is disposed on the substrate and provided for emitting a light. The masking layer having an opening is disposed on the light emitting diode module, and an aperture of the opening is matching with the wavelength of the light. Herein and below, the terminology "matching with the wavelength of the light" means that the matching size is equal to 10-100 times and less than 1000 times of the wavelength so as to generate a diffraction effect obviously. The light passing through the opening will has the feature of directivity and coherency.

According the purpose of the present invention is to provide a light emitting diode device. The light emitting diode device comprises a substrate, a masking layer and a light emitting device module. The masking layer has an opening. The light emitting device module is provided for emitting a light and the wavelength of the light is matching with the aperture of the opening. When the light passes through the opening for diffraction, the light will have the feature of directivity and coherency.

According to the purpose of the present invention is to provide a manufacturing method for providing a light source with directivity and coherency. The manufacturing method comprises the following steps. First, a masking layer is disposed on a light emitting diode module. Second, a light is provided by a light emitting diode module. Final, the light passes an opening of the masking layer for the purpose of diffraction. Herein, an aperture of the opening is matching with the wavelength of the light.

Above all, the light emitting diode device with directivity and coherency and the manufacturing method for providing a light with coherency and directivity have one or more advantage as follows.

(1) The light emitting diode module with large scale may be integrated with the masking layer for obtaining an aperture for emitting the light with micro scale. The manufacturing method of the present invention is more easily than before by using the etching technique to fabricate the opening with micro size on the masking layer.

(2) The manufacturing process of the present invention may be reached by in-plane manufacture instead of epitaxial manufacture substantially. Form which, the purpose of mass production may be reached easily by means of the light emitting diode device of the present invention than the semiconductor laser in the prior art.

(3) The light source of the present invention is a light emitting diode module. The light emitting diode module may own more operation wavelength because it emits the light via excitons, whose band of energy level to emitting light is wide. From which, the light emitting diode module can own more operation wavelength by means of different layout. Nowadays, the light emitting diode module with infrared light to visible light may be implemented in daily life. The wavelength produced by the light emitting diode device of the present invention may be operated more flexible than prior art.

With these and other objects, advantages, and features of the invention that may become hereinafter apparent, the nature of the invention may be more clearly understood by reference to the detailed description of the invention, the embodiments and to the several drawings herein.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PREFERRED EMBODIMENTS

<Top-Emitting LED Device> (The Direction of the Emitting Light is Away from the Substrate)

Figure 1:
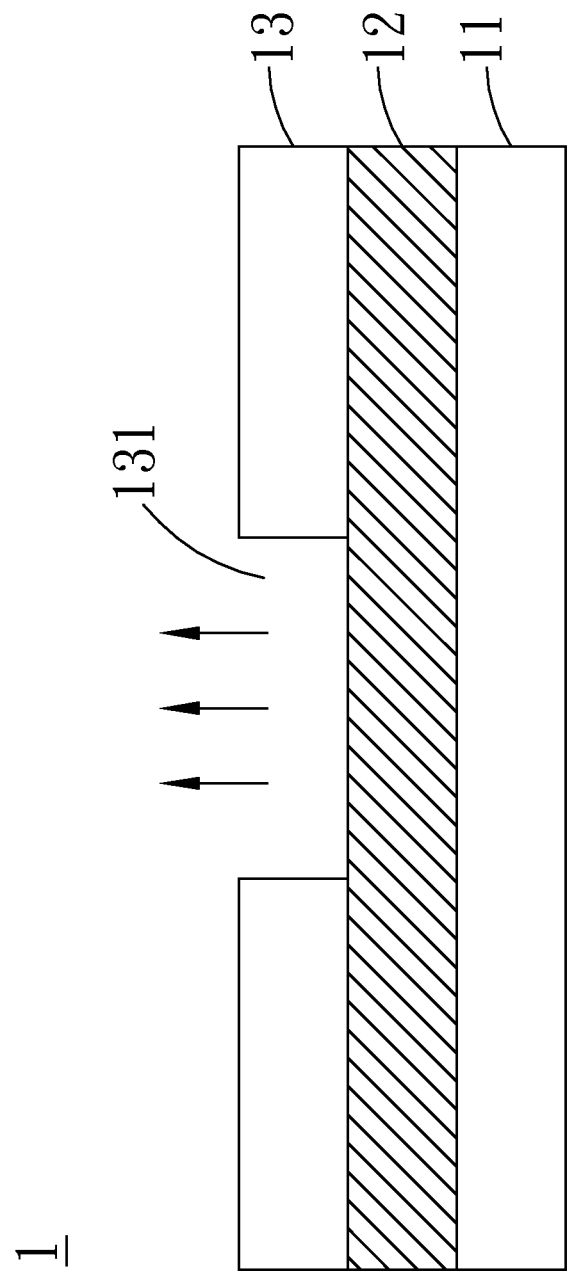
FIG. 1 illustrates a schematic diagram of a light emitting diode device with directivity and coherency in accordance with the first embodiment of the present invention.

Please refer to the FIG. 1, which illustrates a schematic diagram of a light emitting diode device with directivity and coherency in accordance with the first embodiment of the present invention. As shown in FIG. 1, the light emitting diode device 1 with directivity and coherency comprises a substrate 11, a light emitting diode module 12 and a masking layer 13. The light emitting diode module 12 may be an OLED or a PLED. The light emitting diode module 12 is disposed on the substrate 11 and provided for emitting a light. The masking layer 13 is disposed on the light emitting diode module 12 and has an opening 131. The aperture of the opening 131 is matching with the wavelength of the light. When the light passes through the opening 131, the light with directivity and coherency will be provided as a result of the diffraction effect.

Figure 2:
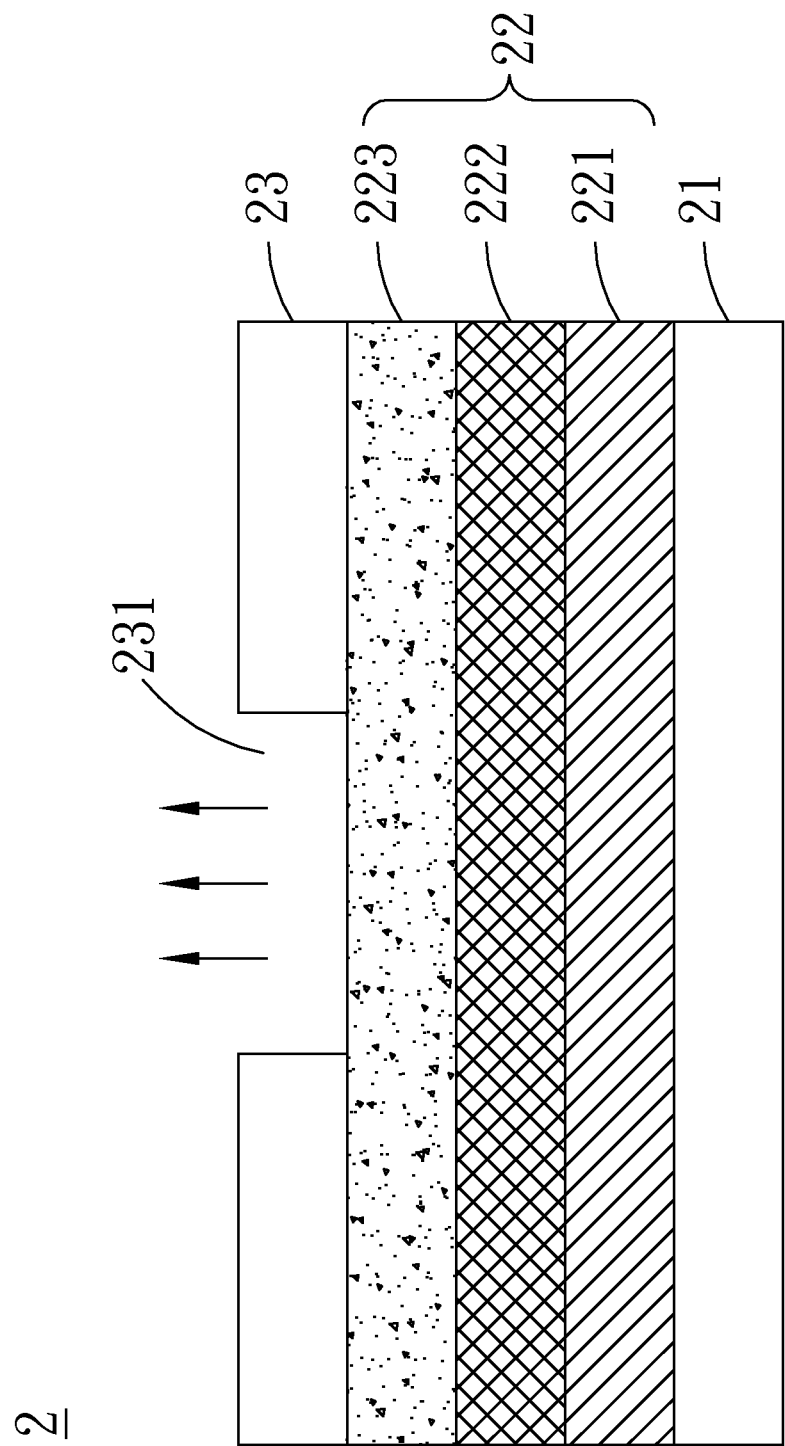
FIG. 2 illustrates a schematic diagram of a light emitting diode device with directivity and coherency in accordance with the second embodiment of the present invention.

Please refer to FIG. 2, which illustrates a schematic diagram of a light emitting diode device with directivity and coherency in accordance with the second embodiment of the present invention. As shown in FIG. 2, the light emitting diode device 2 with directivity and coherency comprises a substrate 21, a light emitting diode module 22 and a masking layer 23. The light emitting diode module 22 is disposed on the substrate 21 and comprises a first electrode 221, a light emitting layer 222 and a second electrode 223. The light emitting layer 222 is disposed on the first electrode 221, and the second electrode 223 is disposed on the light emitting layer 222. The masking layer 23 is disposed on the second electrode 223 of the light emitting diode module 22 and has an opening 231. When a power supply is supplied to the first electrode 221 and the second electrode 223, the light emitting layer 222 will be excited to emit a light. When the aperture of the opening 231 is matching with the wavelength of the light and the light passes through the opening, the light with directivity and coherency will be provided as a result of diffraction effect.

Figure 3:
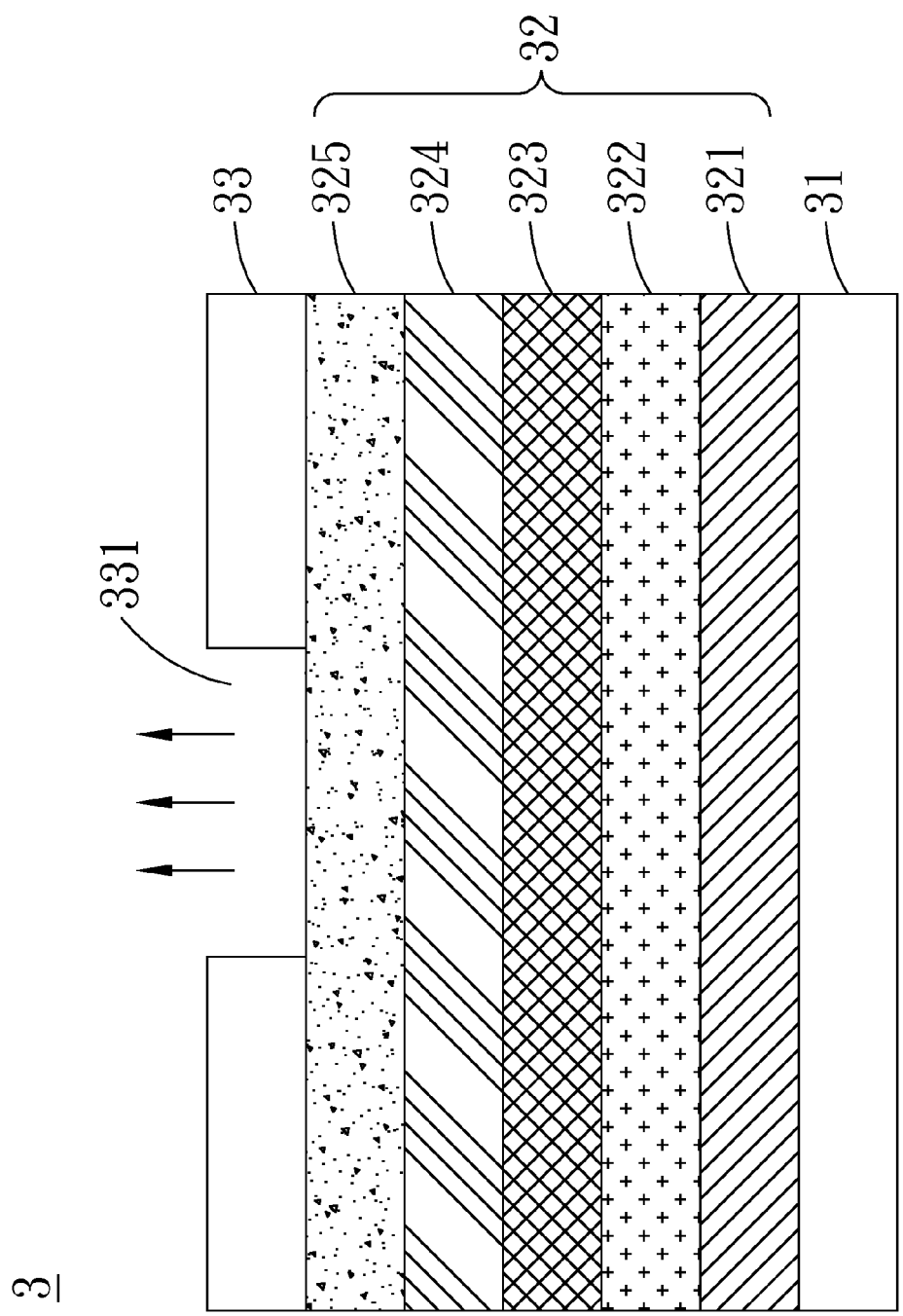
FIG. 3 illustrates a schematic diagram of a light emitting diode device with directivity and coherency in accordance with the third embodiment of the present invention.

Please refer to FIG. 3, which illustrates a schematic diagram of a light emitting diode device with directivity and coherency in accordance with the third embodiment of the present invention. In this embodiment is similar with the second embodiment. The difference between the third embodiment and second embodiment is that the light emitting diode module 32 further comprises a hole transport layer 322 and an electron transport layer 324. The hole transport layer 322 is disposed between the first electrode 321 and the light emitting layer 323. The electron transport layer 324 is disposed between the light emitting layer 323 and the second electrode 325. The coupling efficiency between the electron and the hole will be enhanced by disposing the hole transport layer 322 and the electron transport layer 324, thereby the light emitting efficiency of the light emitting layer 323 may also increased.

Figure 4:
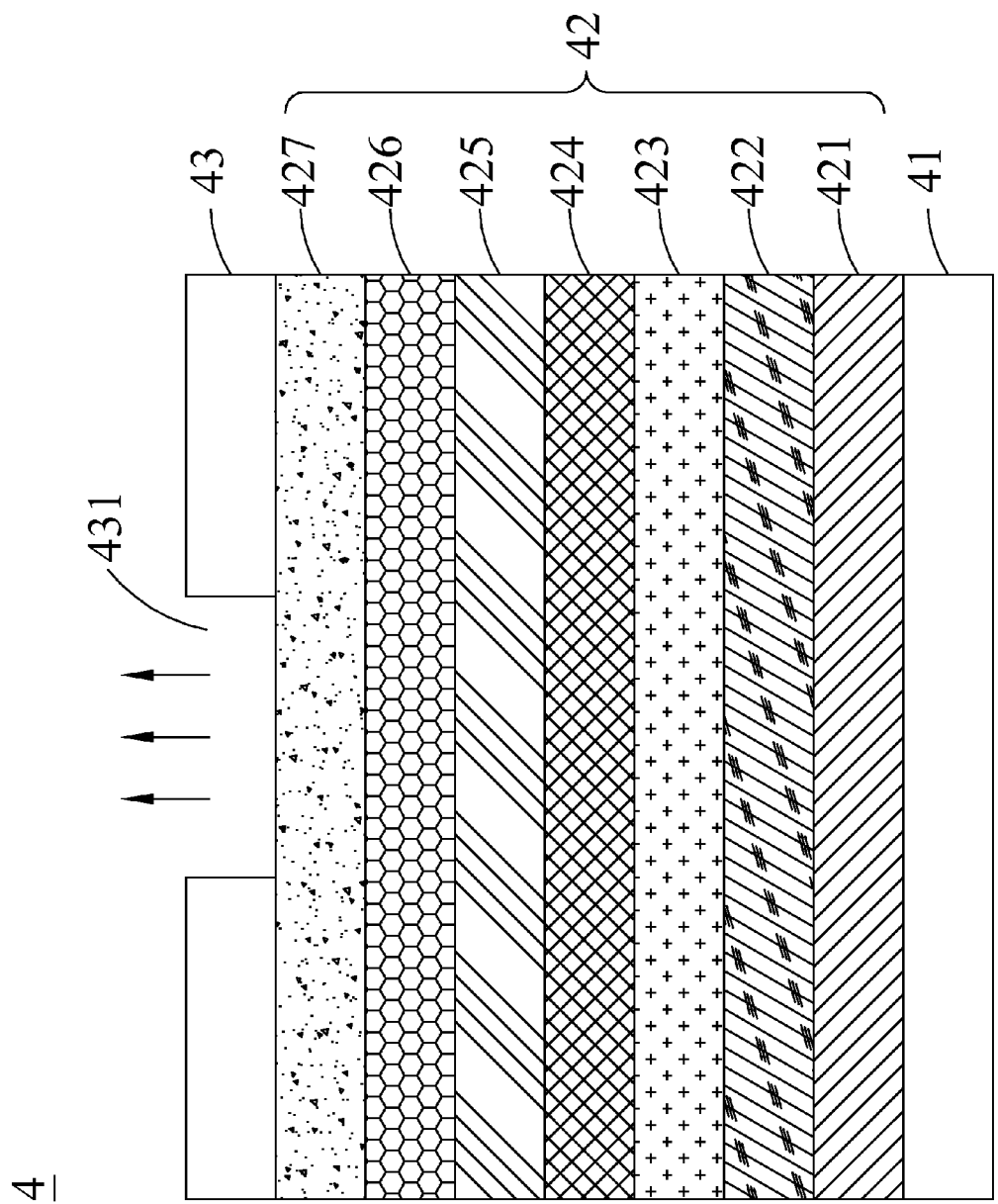
FIG. 4 illustrates a schematic diagram of a light emitting diode device with directivity and coherency in accordance with the fourth embodiment of the present invention.

Please refer to FIG. 4, which illustrates a schematic diagram of a light emitting diode with directivity and coherency in accordance with the fourth embodiment of the present invention. This embodiment is similar with the third embodiment. The difference between this embodiment and the third embodiment is that the light emitting diode module 42 further comprises a hole injection layer 422 and an electron injection layer 426. The hole injection layer 422 is disposed between the first electrode 421 and the hole transport layer 423. The electron injection layer 426 is disposed between the electron transport layer 425 and the second electrode 327. The coupling efficiency between the electron and the hole will be enhanced by disposing the hole injection layer 422, the hole transport layer 423, the electron transport layer 425 and the electron injection layer 426, thereby the light emitting efficiency of the light emitting layer 424 may also increased.

Figure 5:
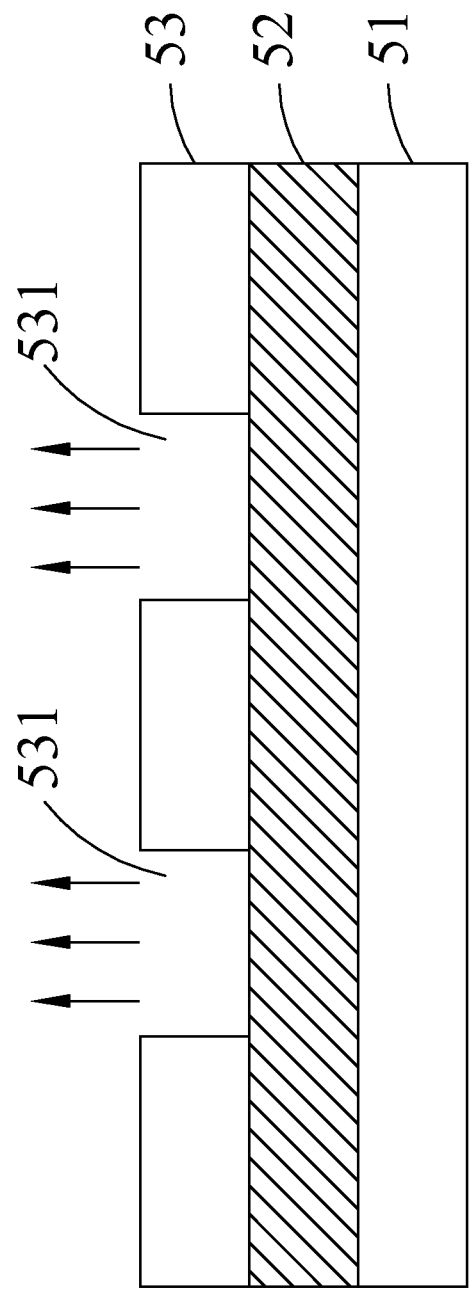
FIG. 5 illustrates a schematic diagram of a light emitting diode device with directivity and coherency in accordance with the fifth embodiment of the present invention.

Please refer to FIG. 5, which illustrates a schematic diagram of a light emitting diode device with directivity and coherency in accordance with the fifth embodiment of the present invention. The difference between this embodiment and the first embodiment is that the masking layer 53 has a plurality of opening 531. A plurality of light sources with directivity and coherency are provided by making the light to pass through the plurality of openings 531 of the light emitting diode device 5.

By the same way, the opening of the masking layer 23, 33, 43 in FIG. 2 to FIG. 4 may be replaced with a plurality of openings of the masking layer. From which, a plurality of light source with directivity and coherency may be provided.

<Bottom-Emitting LED Device> (The Direction of the Emitting Light is Face to the Substrate)

Figure 6:
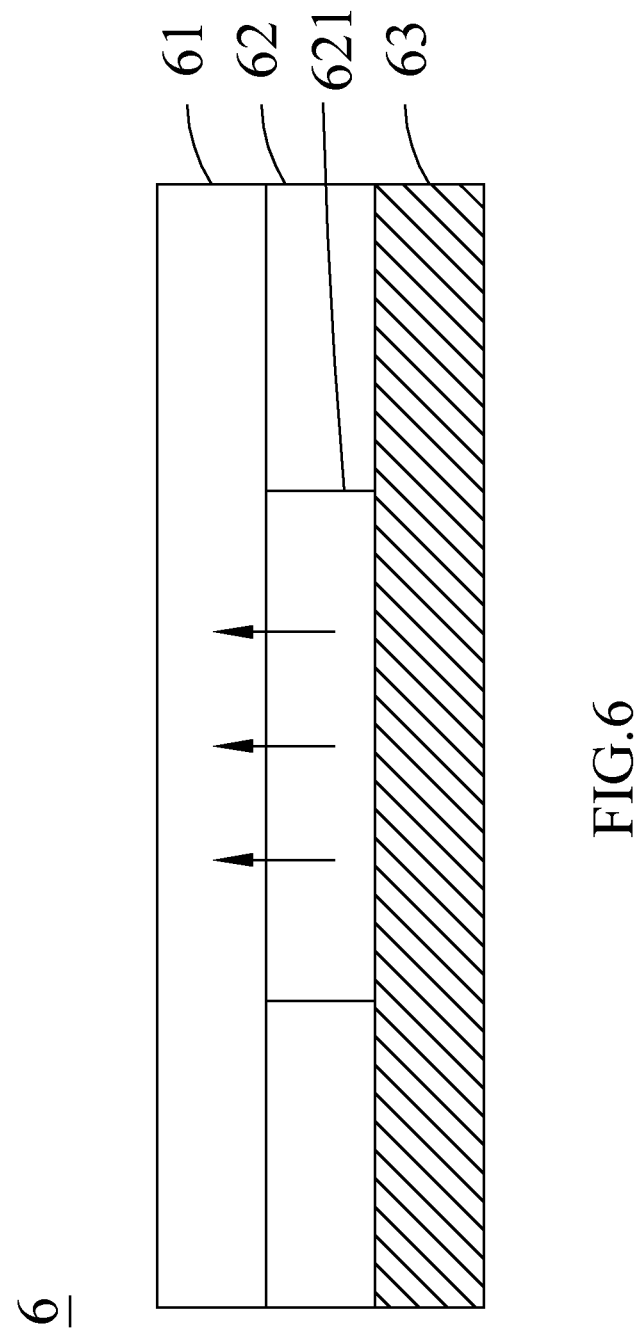
FIG. 6 illustrates a schematic diagram of a light emitting diode device with directivity and coherency in accordance with the sixth embodiment of the present invention.

Please refer to FIG. 6, which shows a schematic diagram of a light emitting diode device with directivity and coherency in accordance with the sixth embodiment of the present invention. As shows in figure, the light emitting diode device 6 with directivity and coherency comprises a substrate 61, a masking layer 62 and a light emitting diode module 63. The masking layer 62 may be fabricated by lithography to form an opening 621 on the masking layer 62 and the masking layer 62 may disposed on the substrate 61. The light emitting diode module 63 disposed on the masking layer 62 may be an OLED or PLED and is provided for emitting a light. The wavelength of the light is matching with the aperture of the opening. When the light passes through the opening for diffraction, the light with directivity and coherency will be provided.

Wherein, the structure of the light emitting diode module 63 may be implemented with the light emitting diode module 22, 32, 42 in FIG. 2, FIG. 3 and FIG. 4.

Figure 7:
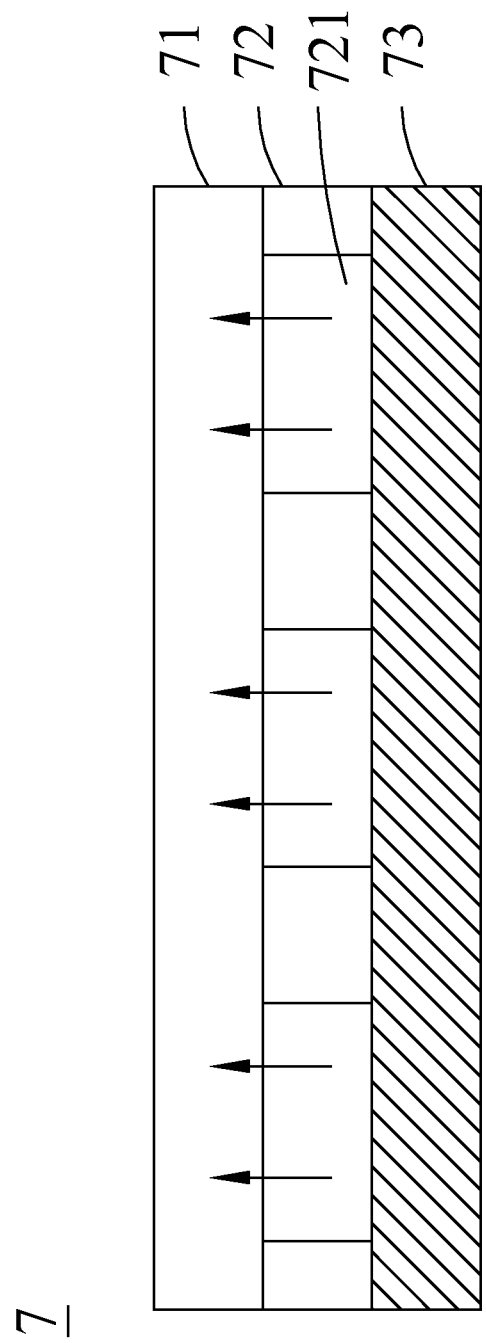
FIG. 7 illustrates a schematic diagram of a light emitting diode device with directivity and coherency in accordance with the seventh embodiment of the present invention.

Please refer to FIG. 7, which illustrates a schematic diagram of a light emitting diode device with directivity and coherency in accordance with the seventh embodiment of the present invention. The difference between this embodiment and the seventh embodiment is that the masking layer 72 has a plurality of opening 721. From which, a plurality of light sources with directivity and coherency of the light emitting diode device 7 may be provided by making the light to pass through the openings 721.

Figure 8:
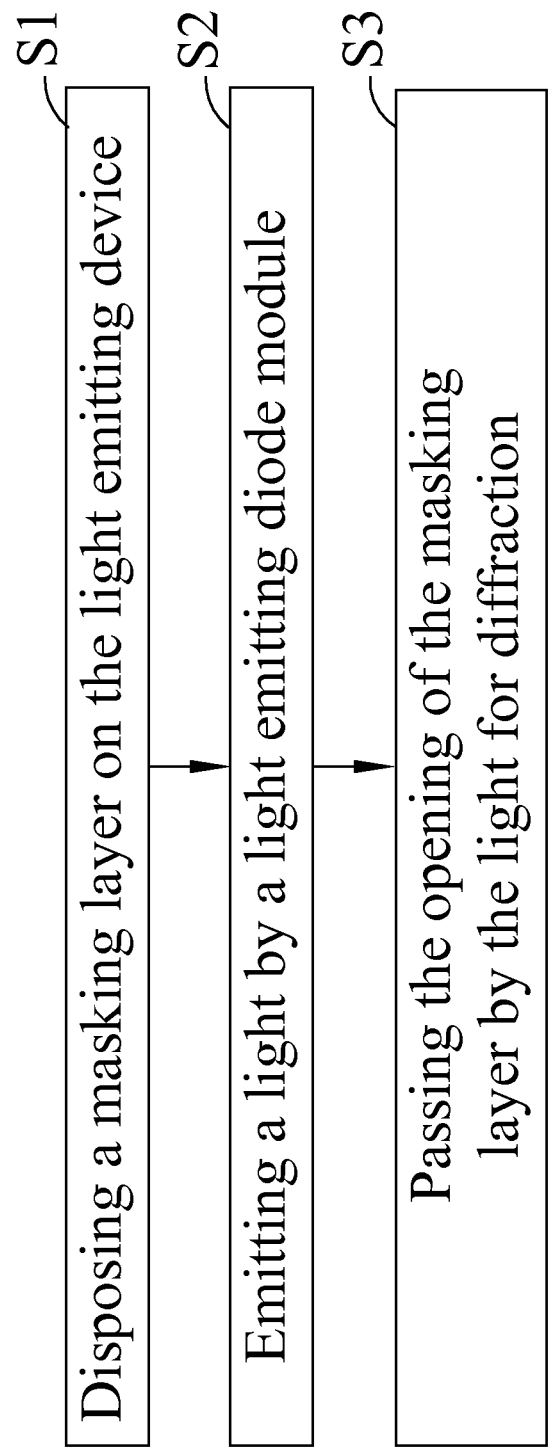
FIG. 8 illustrates a flow chart of a manufacturing method for providing a light with directivity and coherency in accordance with one embodiment of the present invention.

Please refer to FIG. 8, which shows a flow chart of the manufacturing method for providing a light with directivity and coherency in accordance with one embodiment of the present invention. In step S1, disposing a masking layer on the light emitting device. In step S2, emitting a light by a light emitting diode module. In step S3, passing the opening of the masking layer by the light for diffraction. The aperture of the opening is matching with the wavelength of the light.

Exemplary embodiments of the present invention are described herein in the context of a light emitting diode device with directivity and coherency and a manufacturing method for providing a light with directivity and coherency.

While particular embodiments of the present invention have been shown and described, it will be obvious to those skilled in the art that, based upon the teachings herein, changes and modifications may be made without departing from this invention and its broader aspects. Therefore, the appended claims are intended to encompass within their scope of all such changes and modifications as are within the true spirit and scope of the exemplary embodiment(s) of the present invention.

What is claimed is:

1. A light emitting diode device with directivity and coherency, comprising:
   a substrate;
   a masking layer having a plurality of openings and being disposed on the substrate;
   a light emitting diode module being disposed on the masking layer, the light emitting diode module being provided for emitting a light, an aperture of each opening being matching with wavelength of the light, and the light with directivity and coherency being generated by a diffraction effect when the light passes through each opening, wherein the aperture is equal to 10-100 times of the wavelength of the light.

2. The light emitting diode device with directivity and coherency of claim 1, wherein the light emitting diode module is an OLED or a PLED.

3. The light emitting diode device with directivity and coherency of claim 2, the OLED comprising:
   a first electrode being disposed on the masking layer disposed on the substrate;
   a light emitting layer being disposed on the first electrode; and
   a second electrode being disposed on the light emitting layer.

4. A manufacturing method for providing a light with directivity and coherency, comprising the following step:
   Combining a masking layer disposed on the substrate with a light emitting module;
   emitting the light by the light emitting diode module; and
   using an diffraction effect to generate the light with directivity and coherency by means of passing through a plurality of openings of the masking layer, an aperture of each opening being matching with wavelength of the light, wherein the aperture is equal to 10-100 times of the wavelength of the light.

5. The manufacturing method for providing the light with directivity and coherency of claim 4, wherein the light emitting diode module is an OLED or a PLED.

6. The manufacturing method for providing the light with directivity and coherency of claim 5, the OLED comprising:
   a first electrode being disposed on the masking layer combined with the light emitting module;
   a light emitting layer being disposed on the first electrode; and
   a second electrode being disposed on the light emitting layer.

* * * * *